United States Patent

Jorgensen et al.

[15] 3,680,005

[45] *July 25, 1972

[54] INTEGRAL ELECTRICAL POWER DISTRIBUTION NETWORK HAVING STACKED PLURAL CIRCUIT PLANES OF DIFFERING CHARACTERISTIC IMPEDANCE WITH INTERMEDIATE GROUND PLANE FOR SEPARATING CIRCUIT PLANES

[72] Inventors: Arnold J. Jorgensen, Duarte; Lawrence L. Bewley, Cupertino; Kenneth H. White, Newport Beach, all of Calif.

[73] Assignee: Burroughs Corporation, Detroit, Mich.

[ * ] Notice: The portion of the term of this patent subsequent to July 7, 1987, has been disclaimed.

[22] Filed: Dec. 15, 1969

[21] Appl. No.: 885,117

Related U.S. Application Data

[63] Continuation-in-part of Ser. No. 537,049, March 24, 1966, Pat. No. 3,519,959.

[52] U.S. Cl. ....................................333/6, 333/33, 333/84, 333/84 M, 317/101 Cm

[51] Int. Cl. ....................H01p 3/02, H01p 3/18, H05k 1/04

[58] Field of Search ....................317/101; 174/68.5; 333/84, 333/6, 33

[56] References Cited

UNITED STATES PATENTS

| | | | |
|---|---|---|---|
| 3,290,756 | 12/1966 | Dreyer | 174/68.5 X |
| 3,316,618 | 5/1967 | Guarracini | 174/68.5 X |
| 3,316,619 | 5/1967 | Beelitz | 174/68.5 X |
| 1,999,137 | 4/1935 | Flewelling | 317/101 |
| 3,155,881 | 10/1964 | St. Jean | 317/101 |
| 3,179,913 | 4/1965 | Mittler et al. | 174/68.5 X |
| 3,218,584 | 10/1965 | Ayer | 333/84 |
| 3,351,702 | 10/1967 | Stephens | 174/68.5 |
| 3,351,816 | 10/1967 | Sear et al. | 317/101 |
| 3,519,959 | 7/1970 | Bewley et al. | 333/6 |

OTHER PUBLICATIONS

" Multi-Surface Printed Wiring Board" Johnson, IBM Technical Disclosure Bulletin Vol. 8 No. 3 August 1965 p. 350

" Reference Data for Radio Engineers" Fourth Edition, International Telephone and Telegraph Corp., New York, July 1956 TK6552 F4; pages 588-594

" Semiconductor Networks for Microelectronics" Lathrop et al. in Electronics May 13, 1960, pages 69 and 77-78

*Primary Examiner*—Herman Karl Saalbach
*Assistant Examiner*—Marvin Nussbaum
*Attorney*—Christie, Parker & Hale

[57] ABSTRACT

A plurality of conductive sheets are stacked in spaced relationship. A plurality of dielectric sheets are stacked in the spaces between the conductive sheets to form with the conductive sheets an integral structure. A source of bias voltage is coupled to a first pair of the conductive sheets, a source of clock pulses is coupled to a second pair of the conductive sheets having a larger characteristic impedance than the first pair, and a source of logic levels is coupled to a third pair of the conductive sheets having a larger characteristic impedance than the second pair. The sources are coupled to their respective pairs of conductive sheets such that alternate conductive sheets are grounded. The terminal pins of circuit board connectors are selectively connected to the conductive sheets.

10 Claims, 2 Drawing Figures

INVENTORS
ARNOLD J. JORGENSEN
LAWRENCE L. BEWLEY
BY KENNETH H. WHITE

Christie, Parker & Hale
ATTORNEYS

INTEGRAL ELECTRICAL POWER DISTRIBUTION NETWORK HAVING STACKED PLURAL CIRCUIT PLANES OF DIFFERING CHARACTERISTIC IMPEDANCE WITH INTERMEDIATE GROUND PLANE FOR SEPARATING CIRCUIT PLANES

CROSS-REFERENCE TO RELATED APPLICATIONS

This is a continuation-in-part of a copending, commonly owned application, Ser. No. 537,049, filed Mar. 24, 1966 (U.S. Pat. No. 3,519,959 issued July 7, 1970), the disclosure of which is incorporated herein by reference. The disclosure of the present application is basically a reorganization of the material disclosed in the cross-referenced application.

BACKGROUND OF THE INVENTION

This invention relates to the supply of electrical power to circuit board connectors and, more particularly, to a power distribution network that accommodates sources of electrical power with different frequency characteristics and/or output power capabilities.

A major problem in large electronic installations such as digital computers is the distribution of electrical power to the individual circuit boards that are mounted on large expansive racks. Examples of electrical power with different frequency characteristics and power output capabilities to be distributed are the following: bias voltage, i.e., direct current power to operate the amplifiers and other components on the circuit boards; clock pulses, i.e., high frequency power to time logical functions performed on the circuit boards; and logic levels, i.e., high frequency power representative of the results of the logic functions performed on the boards.

Mittler et al. U.S. Pat. No. 3,179,913 teaches that logic levels can be coupled between circuit boards by a network comprising a plurality of conductive sheets stacked in spaced relationship and a plurality of dielectric sheets stacked in the space between the conductive sheets. The pins of circuit board connectors pass transversely through the network and make selective connections to the appropriate conductive sheets. The conductive sheets may have a number of individual circuit paths that form the connections between the appropriate connector pins. The Mittler et al. disclosure does not address itself to the problem of distributing electrical power having different frequency characteristics or power output capabilities. Only one type of source is involved, namely, logic levels.

In an article entitled, "Semiconductor Networks for Microelectronics," in Electronics Magazine, May 13, 1960, pages 69 through 78, a power distribution network is disclosed that supplies to circuit boards both bias voltage and logic levels. The network comprises sheets of 2-mil-thick copper-clad teflon stacked one on top of each other so the teflon insulates the copper sheets from each other. Since the teflon sheets are all the same thickness, the fact that the bias voltage and the logic levels have different frequency characteristics is not taken into account in the design of the network.

SUMMARY OF THE INVENTION

The invention contemplates a power distribution network that is adapted to couple electrical power sources having different frequency characteristics and/or different output power capabilities to circuit board connectors. The network comprises a plurality of conductive sheets stacked in spaced relationship and a plurality of dielectric sheets stacked in the spaces between the conductive sheets to form an integral structure. Adjacent pairs of the conductive sheets have different characteristic impedances. Electrical power sources having different frequency characteristics and/or output power capabilities are coupled to the respective pairs of conductive sheets having appropriate characteristic impedances for such sources. Most advantageously, the different characteristic impedances are formed by providing dielectric sheets that have different thicknesses. Preferably, alternate conductive sheets are grounded to provide isolation between the power carrying conductive sheets.

In a preferred embodiment of the invention, a power distribution network is designed to accommodate a source of bias voltage, i.e., direct current power; a source of clock pulses, i.e., high frequency power with a relatively high output power capability; and a source of logic levels, i.e., high frequency power with a relatively low output power capability. The characteristic impedance of the pair of conductive sheets carrying the bias voltage is as small as practicable; the characteristic impedance of the pair of conductive sheets carrying the logic levels is as large as practicable; and the characteristic impedance of the pair of conductive sheets carrying the clock pulses is an intermediate value, i.e., between the characteristic impedances of the other two pairs.

BRIEF DESCRIPTION OF THE DRAWING

The features of a specific embodiment of the best mode contemplated of carrying out the invention are illustrated in the drawing, in which.

DETAILED DESCRIPTION OF THE SPECIFIC EMBODIMENT

Figure 1:
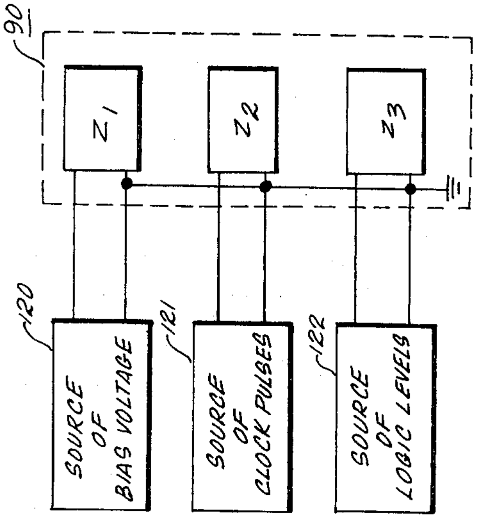
FIG. 1 is a block schematic diagram that depicts three electrical power sources connected, respectively, to loads having different characteristic impedances.

The disclosure of the cross-referenced application, Ser. No. 537,049, is incorporated herein by reference. FIG. 1 of the present application is basically a block diagram representation of FIG. 4 of the cross-referenced application and its associated written description; and FIG. 2 of the present application is basically a consolidation of FIGS. 2, 3, 4, 5, and 8 of the cross-referenced application and their associated written description.

Figure 2:
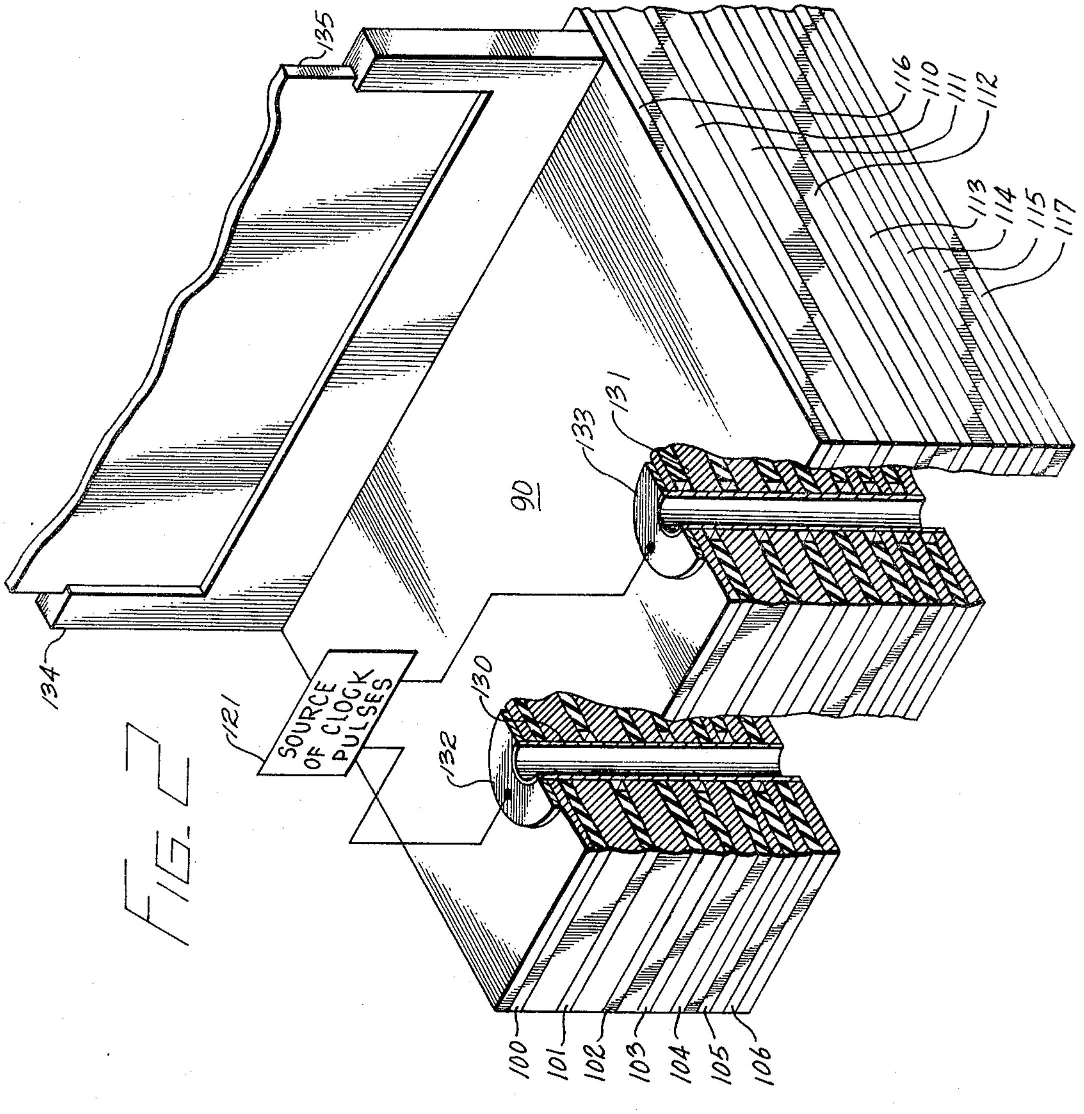
FIG. 2 is a schematic diagram depicting a power distribution network incorporating the principles of the invention and the manner of coupling one of the power sources to the network.

In FIG. 2 of the present application, there is shown a power distribution network comprising sheets of conductive material 100, 101, 102, 103, 104, 105, and 106 stacked in spaced relationship. Sheets of dielectric material 110, 111, 112, 113, 114, and 115 are stacked in the space between sheets 100 through 106, a sheet of dielectric material 116 is stacked adjacent to sheet 100, and a sheet of dielectric material 117 is stacked adjacent to sheet 106 to form an integral structure. As depicted in FIG. 2, dielectric sheets 110 and 111 are thicker than the remaining dielectric sheets. Consequently, the characteristic impedance $Z_3$ between conductive sheet 101 and conductive sheets 100 and 102 is large, i.e., of the order of 50–100 ohms. Further, dielectric sheets 112 and 113, although not as thick as dielectric sheets 110 and 111, are thicker than the remaining dielectric sheets. Consequently, the characteristic impedance $Z_2$ between conductive sheet 103 and conductive sheets 102 and 104 is an intermediate value, i.e., of the order of 10–15 ohms. The characteristic impedance $Z_1$ between conductive sheet 105 and conductive sheets 104 and 106 is small, i.e., of the order of 0.1 or 0.2 ohms.

In FIG. 1 are shown a source of bias voltage 120, a source of clock pulses 121, and a source of logic levels 122. As depicted, one output terminal of each of sources 120, 121, and 122 is connected to a common ground. Source 120 provides direct current bias to operate amplifiers and other components mounted on circuit boards. Source 121 provides high frequency clock pulses to control the timing of logical functions performed by the components on the circuit boards. Normally, one source of clock pulses, such as source 121, supplies an entire power distribution network. Thus, it is assumed that source 121 has a high output power capability. Source 122 provides high frequency changes in logical levels, i.e., a binary "1" or a binary "0", that represent the result of a computation or logical function performed by the components on one circuit board to be transferred to another circuit board. There are ordinarily many sources of logic levels similar to source 122 that are to be coupled from one circuit board through an independent circuit path in lower distribution network 90 to another circuit board. Thus, source 122 and all the other similar sources have a low output power capability.

In FIG. 1, the pairs of conductive sheets comprising power distribution network 90 are represented by blocks $Z_1$, $Z_2$, and $Z_3$.

It is desirable that the pair of conductive sheets carrying the bias voltage from source 120 has as small a characteristic impedance as practicable. The smaller the characteristic impedance, the more noise and other fluctuations in the bias voltage are filtered out by power distribution network 90. Thus, the ungrounded terminal of source 120 is connected to conductive sheet 105, and conductive sheets 104 and 106 are connected to the common ground. Accordingly, the small characteristic impedance $Z_1$ is presented by power distribution network 90 to source 120, as depicted in FIG. 1.

With regard to high frequency power, there are conflicting considerations in the selection of an appropriate characteristic impedance for the pairs of conductive sheets. A large characteristic impedance reduces the power requirements of the source. A small characteristic impedance reduces the phase distortion of the signal.

In the case of clock pulses, appreciable phase distortion cannot be tolerated because it would affect the timing of the various logical functions, but the expense associated with drive circuitry capable of producing high output power can be justified because there is ordinarily only one source associated with a single power distribution network. Thus, the ungrounded terminal of source 121 is connected to conductive sheet 103, and conductive sheet 102 is connected to the common ground. Accordingly, the intermediate characteristic impedance $Z_2$ is presented to source 121, as depicted in FIG. 1.

In the case of logic levels, appreciable phase distortion can be tolerated but the expense associated with the provision of drive circuitry capable of producing high output power would be prohibitive because of the large number of sources of logic levels. Thus, the ungrounded terminal of source 122 is connected to conductive sheet 101, and conductive sheet 100 is connected to the common ground. Accordingly, the large characteristic impedance $Z_3$ is presented to source 122, as depicted in FIG. 1. The connection of alternate conductive sheets, namely, sheets 100, 102, 104, and 106, to the common ground serves to isolate from each other the different sources of electrical power distributed by network 90, i.e., bias voltage, clock pulses, and logic levels.

FIG. 2 illustrates the manner in which the electrical connections are made from source 121 to the conductive sheets of network 90. Conductive tubes 130 and 131 extend transversely through the sheets comprising network 90. Tube 130 has a conductive ring 132 disposed on the surface of sheet 116, and tube 131 has a conductive ring 133 disposed on the surface of sheet 116. The grounded output terminal of source 121 is electrically connected to ring 132, and the ungrounded output terminal of source 121 is electrically connected to ring 133. As depicted in FIG. 2, selected ones of the conductive sheets comprising network 90 are electrically connected to tubes 130 and 131. Specifically, sheets 100, 102, 104, and 106 are electrically connected to tube 130, and sheet 103 is electrically connected to tube 131. In similar fashion, the ungrounded output terminal of source 120 is connected to a conductive tube (not shown) that passes transversely through network 90 and is electrically connected to sheet 105. The grounded output terminal of source 120 is also electrically connected to ring 132 of tube 130. The terminal pins of a plurality of circuit board connectors, such as that designated 134, are selectively connected to conductive sheets 100 through 106 in the manner described in the cross-referenced application. Circuit boards, such as that designated 135, engage the connectors. Bias voltage to operate the components on the circuit boards is distributed by conductive sheets 104, 105, and 106 to the appropriate terminal pins and from there to the circuit boards. Similarly, clock pulses for timing the logical functions performed by the components on the circuit boards are distributed by conductive sheets 102, 103, and 104 to the appropriate terminal pins and from there to the circuit boards. The sources of logic levels, such as source 122, are connected to conductive sheets 100, 101, and 102 by the pins of the circuit board connectors. Thus, the results of the logical functions performed on one circuit board are transferred from the logical output of its circuitry through network 90 to the logical input of the circuitry on another circuit board. If needed, more conductive sheets could be provided for transferring the results of the logical functions from circuit board to circuit board.

Although it is particularly advantageous to change the thickness of the dielectric sheets to provide different characteristic impedances from the various parts of conductive sheets, any of the other parameters that affect characteristic impedance could be changed. For example, materials having different dielectric constants could be employed for the different dielectric sheets. Further, there could be other sources of electric power at different frequencies or with different power output capabilities for which other characteristic impedances are appropriate. In such case, additional pairs of conductive sheets having the appropriate characteristic impedances would be added to network 90. In some instances, the dielectric material could be air.

What is claimed is:

1. An electrical power distribution network for supplying electrical power with different frequency characteristics to component boards, the network comprising:

a plurality of pairs of conductive sheets stacked in spaced relationship;

dielectric material disposed in the space between each of the conductive sheets to form with the conductive sheets an integral structure, the properties of the conductive sheets and the dielectric material being so chosen that pairs of the conductive sheets have different characteristic impedances;

a first source of electrical power;

means for connecting the first source of electrical power to a first pair of conductive sheets having an appropriate characteristic impedance;

a second source of electrical power with a different frequency characteristic from the first source;

means for connecting the second source to a second pair of conductive sheets having an appropriate characteristic impedance different from that of the first pair;

a plurality of connectors for receiving component boards, each connector having a plurality of terminals; and means for connecting selected terminals of each connector to the first and second pairs of the conductive sheets to supply the desired electrical power thereto, the first and second sources each having one output terminal connected to a common ground and alternate ones of the conductive sheets are connected to the common ground to isolate the sources from each other.

2. The electrical power distribution network of claim 1, in which the dielectric material comprises sheets of material occupying completely the space between the conductive sheets, the dielectric sheet between the first pair of conductive sheets having a different thickness from the dielectric sheet between the second pair of conductive sheets.

3. The electrical power distribution network of claim 2, in which the first source provides direct current power, the second source provides high frequency alternating current power, and the dielectric sheet between the second pair of conductive sheets is thicker than the dielectric sheet between the first pair of conductive sheets.

4. The electrical power distribution network of claim 1, in which the first source provides direct current power, the second source provides high frequency alternating current power, and the characteristic impedance between the second pair of conductive sheets is larger than the characteristic impedance between the first pair of conductive sheets.

5. The electrical power distribution network of claim 1, additionally comprising: a third source of electrical power having a different output power capability from the second source; means for connecting the third source of electrical power to a third pair of conductive sheets having an appropriate characteristic impedance different from that of the first and second pairs; and means for connecting selected terminals of each connector to the third pair of the conductive sheets to supply the desired electrical power thereto.

6. The electrical power distribution network of claim 5, in which logical functions are performed on the circuit boards, the first source provides direct current power, the second source provides high frequency clock pulses for timing the logical functions performed on the circuit boards; the third source provides logic levels representative of the result of a logical function performed on one circuit board; the characteristic impedance of the second pair of conductive sheets is larger than the characteristic impedance of the first pair of conductive sheets; and the characteristic impedance of the third pair of conductive sheets is larger than the characteristic impedance of the second pair of conductive sheets.

7. An electrical power distribution network for supplying electrical power to circuit boards on which logical functions are performed, the network comprising:

a plurality of pairs of conductive sheets stacked in spaced relationship;

dielectric material disposed in the space between each of the conductive sheets to form an integral structure with the conductive sheets, the properties of the conductive sheets and the dielectric material being so chosen that pairs of the conductive sheets have different characteristic impedances;

a plurality of circuit board connectors, each connector having a plurality of terminals;

a plurality of circuit boards engaging the respective connectors, the circuit boards supporting electrical circuitry having a low output power capability for performing timed logical functions, the logical inputs and outputs to the circuitry on each board being coupled to a first selected group of terminals of the respective connectors;

a source of electrical power providing high frequency clock pulses for timing the logical functions performed on the circuit boards, a source of clock pulses having a higher output power capability than the electrical circuitry for performing the logical functions;

means for connecting the source to a first pair of conductive sheets having an appropriate, low characteristic impedance;

means for connecting a second selected group of terminals of each connector to the first pair of conductive sheets to supply clock pulses thereto; and means for connecting the first selected group of terminals of each connector to a second pair of conductive sheets having an appropriate, high characteristic impedance to couple the logical output of one circuit board to the logical input of another circuit board, the source and the circuitry on the circuit boards have a common ground and alternate ones of the conductive sheets are connected to the common ground to isolate the first and second pairs of conductive sheets from each other.

8. The power distribution network of claim 7, additionally comprising: a source of electrical power providing direct current bias for the circuitry on the circuit boards; means for connecting the source of direct current bias to a third pair of conductive sheets having an appropriate characteristic impedance substantially lower than the characteristic impedance of the first pair of conductive sheets, the source of direct current bias sharing the common ground; and means for connecting a third selected group of terminals of each connector to the third pair of conductive sheets to supply bias thereto.

9. The power distribution network of claim 7, additionally comprising: a source of electrical power providing direct current bias for the circuitry on the circuit boards; means for connecting the source of direct current bias to a third pair of conductive sheets having a characteristic impedance substantially lower than the characteristic impedance of the first pair of conductive sheets; and means for connecting a third group of selected terminals of each connector to the third pair of conductive sheets to supply bias thereto.

10. The power distribution network of claim 9, in which the characteristic impedance of the first pair of conductive sheets is of the order of 10 to 15 ohms, the characteristic impedance of the second pair of conductive sheets is of the order of 75 to 100 ohms, and the characteristic impedance of the third conductive sheet is of the order of 1 to 5 ohms.

* * * * *